US012772912B2

(12) United States Patent
Lin et al.

(10) Patent No.: US 12,772,912 B2
(45) Date of Patent: Oct. 20, 2026

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Jing Cheng Lin, Suwon-si (KR); Youngkun Jee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 334 days.

(21) Appl. No.: 18/655,903

(22) Filed: May 6, 2024

(65) Prior Publication Data

US 2025/0015063 A1 Jan. 9, 2025

(30) Foreign Application Priority Data

Jul. 5, 2023 (KR) ........................ 10-2023-0087270

(51) Int. Cl.

| | |
|---|---|
| ***H10W 90/00*** | (2026.01) |
| ***H10B 80/00*** | (2026.01) |
| ***H10W 20/20*** | (2026.01) |
| ***H10W 40/22*** | (2026.01) |
| ***H10W 70/60*** | (2026.01) |
| ***H10W 70/685*** | (2026.01) |
| ***H10W 72/20*** | (2026.01) |
| ***H10W 74/10*** | (2026.01) |

(Continued)

(52) U.S. Cl.

CPC ............ *H10W 90/00* (2026.01); *H10B 80/00* (2023.02); *H10W 20/20* (2026.01); *H10W 40/22* (2026.01); *H10W 70/611* (2026.01); *H10W 70/685* (2026.01); *H10W 72/20* (2026.01); *H10W 74/111* (2026.01); *H10W 90/297* (2026.01); *H10W 74/15* (2026.01); *H10W 90/722* (2026.01); *H10W 90/724* (2026.01); *H10W 90/732* (2026.01); *H10W 90/736* (2026.01); *H10W 90/792* (2026.01)

(58) Field of Classification Search

CPC ... H10W 20/20; H10W 70/60; H10W 70/611; H10W 70/635; H10W 90/297; H10W 90/736; H10W 90/288; H10W 90/724; H10W 90/401; H10W 90/734

See application file for complete search history.

(56) References Cited

U.S. PATENT DOCUMENTS 11,393,805 B2 7/2022 Yu et al.
11,450,615 B2 9/2022 Tsai et al.
(Continued)

*Primary Examiner* — Jose R Diaz
(74) *Attorney, Agent, or Firm* — Sughrue Mion, PLLC

(57) ABSTRACT

Provided is a semiconductor package including a redistribution substrate, a first semiconductor chip on the redistribution substrate, a second semiconductor chip on the redistribution substrate and spaced apart from the first semiconductor chip in a horizontal direction, a third semiconductor chip on the second semiconductor chip, and a heat dissipation chip on the first semiconductor chip and spaced apart from the third semiconductor chip in the horizontal direction, wherein the second semiconductor chip includes a plurality of through vias passing through at least a portion of the second semiconductor chip in a vertical direction, and wherein a metal pad and an adhesive layer are between the first semiconductor chip and the heat dissipation chip.

20 Claims, 20 Drawing Sheets

(51) Int. Cl.
*H10W 74/15* (2026.01)
*H10W 90/20* (2026.01)

(56) References Cited

U.S. PATENT DOCUMENTS

| | | | | |
|---|---|---|---|---|
| 11,469,208 | B2 | 10/2022 | Jeng et al. | |
| 11,587,905 | B2 | 2/2023 | Lin et al. | |
| 2022/0344304 | A1 * | 10/2022 | Pan | H10P 72/74 |
| 2023/0009553 | A1 | 1/2023 | Yu et al. | |
| 2023/0116326 | A1 | 4/2023 | Yang et al. | |
| 2024/0120280 | A1 * | 4/2024 | Mun | H10B 80/00 |
| 2025/0006582 | A1 * | 1/2025 | Lin | H10B 80/00 |

* cited by examiner

SEMICONDUCTOR PACKAGE AND METHOD OF MANUFACTURING THE SAME

CROSS-REFERENCE TO RELATED APPLICATION

This application is based on and claims priority to Korean Patent Application No. 10-2023-0087270, filed on Jul. 5, 2023, in the Korean Intellectual Property Office, the disclosure of which is incorporated herein in its entirety by reference.

BACKGROUND

Embodiments of the present application relate to a semiconductor package and a method of manufacturing the same, and more particularly, to a semiconductor package including a redistribution substrate and a method of manufacturing the semiconductor package.

As the electronics industry advances rapidly and the demands of users increase, electronic devices are being more and more miniaturized and light. As electronic devices are miniaturized and light, semiconductor packages are being miniaturized and made light and moreover need high performance, large capacity, and high reliability. As the high performance and large capacity of semiconductor packages are implemented, the power consumption of semiconductor packages is increasing. Therefore, the size/performance and heat dissipation characteristics of semiconductor packages are increasing in significance.

SUMMARY

One or more embodiments provide a semiconductor package and a method of manufacturing the same, in which structural reliability is enhanced.

According to an aspect of an embodiment, there is provided a semiconductor package including a redistribution substrate, a first semiconductor chip on the redistribution substrate, a second semiconductor chip on the redistribution substrate and spaced apart from the first semiconductor chip in a horizontal direction, a third semiconductor chip on the second semiconductor chip, and a heat dissipation chip on the first semiconductor chip and spaced apart from the third semiconductor chip in the horizontal direction, wherein the second semiconductor chip includes a plurality of through vias passing through at least a portion of the second semiconductor chip in a vertical direction, and wherein a metal pad and an adhesive layer are between the first semiconductor chip and the heat dissipation chip.

According to another aspect of an embodiment, there is provided a semiconductor package including a redistribution substrate, a first semiconductor chip on the redistribution substrate, a second semiconductor chip on the redistribution substrate and spaced apart from the first semiconductor chip in a horizontal direction, a third semiconductor chip on the second semiconductor chip, a heat dissipation chip on the first semiconductor chip and spaced apart from the third semiconductor chip in the horizontal direction, a fourth semiconductor chip between the first semiconductor chip and the heat dissipation chip, and a sealant on the redistribution substrate and on a side surface of the first semiconductor chip, a side surface of the second semiconductor chip, and a side surface the fourth semiconductor chip, wherein the second semiconductor chip includes a plurality of through vias passing through at least a portion of the second semiconductor chip in a vertical direction, and wherein a metal pad and an adhesive layer are between the first semiconductor chip and the heat dissipation chip.

According to another aspect of an embodiment, there is provided a semiconductor package including a redistribution substrate including one or more redistribution insulation layers stacked in a vertical direction, a redistribution line extending in a horizontal direction in the one or more redistribution insulation layers, and a redistribution via extending in the vertical direction in each of the one or more redistribution insulation layers, a first semiconductor chip on the redistribution substrate, the first semiconductor chip including a first substrate and a first chip pad, a second semiconductor chip on the redistribution substrate and spaced apart from the first semiconductor chip in the horizontal direction, the second semiconductor chip including a second substrate, a second chip pad, and a plurality of through vias passing through at least a portion of the second substrate in the vertical direction, a third semiconductor chip on the second semiconductor chip, a heat dissipation chip on the first semiconductor chip and spaced apart from the third semiconductor chip in the horizontal direction, a first connector between the first semiconductor chip and the redistribution substrate, a second connector between the second semiconductor chip and the redistribution substrate, a third connector between the third semiconductor chip and the second semiconductor chip, and a heat dissipation connector between the heat dissipation chip and the first semiconductor chip, the heat dissipation connector including a metal pad and an adhesive layer.

BRIEF DESCRIPTION OF DRAWINGS

Embodiments will be more clearly understood from the following detailed description taken in conjunction with the accompanying drawings in which.

DETAILED DESCRIPTION OF EMBODIMENTS

Figure 1:
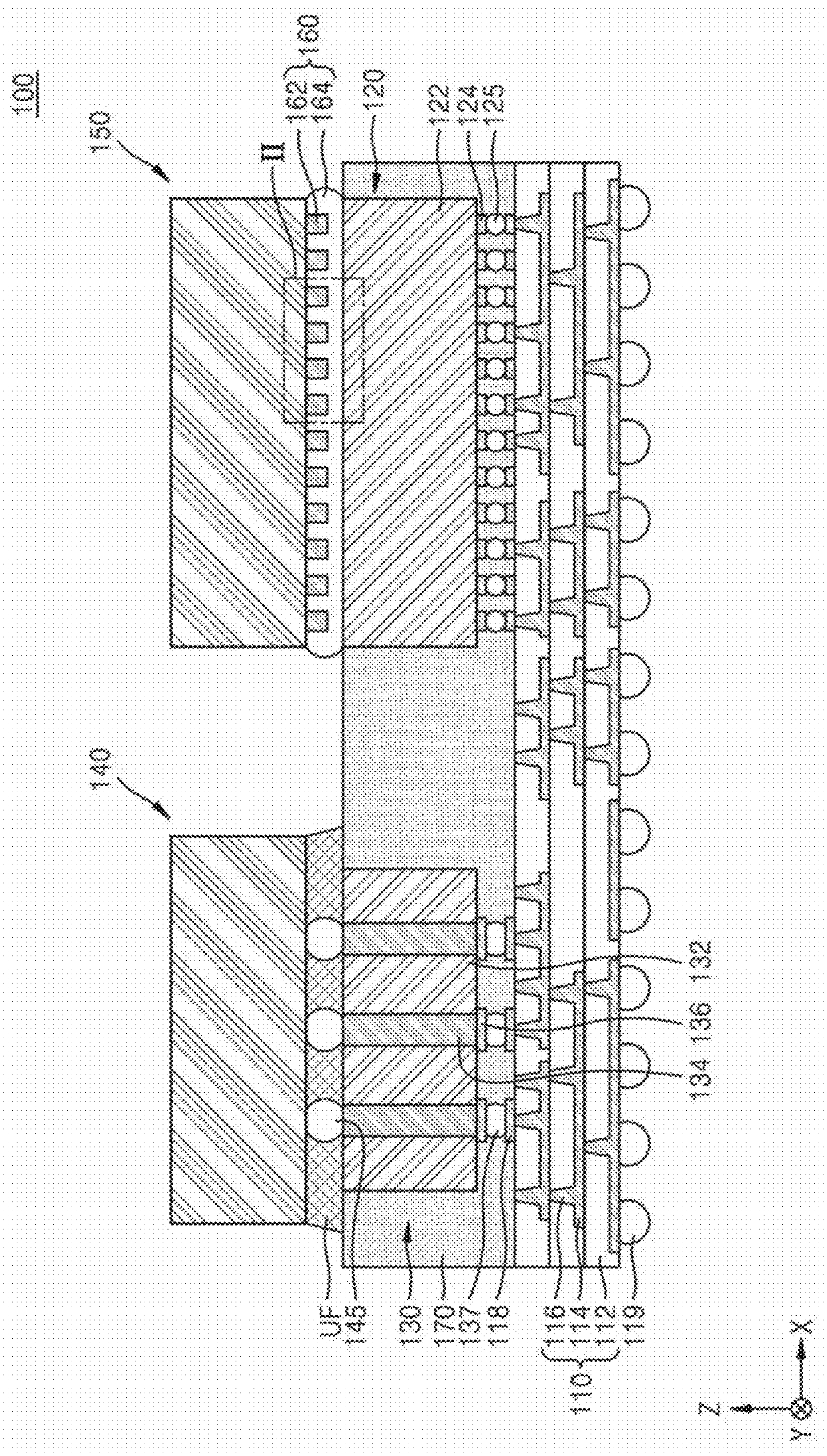
FIG. 1 is a cross-sectional view of a semiconductor package according to an embodiment.

Hereinafter, embodiments will be described in detail with reference to the accompanying drawings. Like reference numerals refer to like elements in the drawings, and their repeated descriptions are omitted. Embodiments described herein are example embodiments, and thus, the disclosure is not limited thereto.

It will be understood that, although the terms first, second, third, fourth, etc. may be used herein to describe various elements, components, regions, layers and/or sections (collectively "elements"), these elements should not be limited by these terms. These terms are only used to distinguish one element from another element. Thus, a first element described in this description section may be termed a second element or vice versa in the claim section without departing from the teachings of the disclosure.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 2:
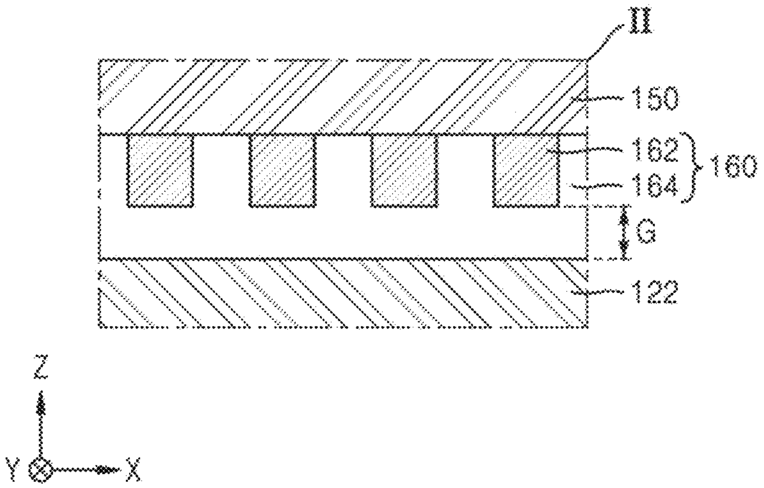
FIG. 2 is a cross-sectional view illustrating the enlargement of a region II of FIG. 1.

FIG. 1 is a cross-sectional view of a semiconductor package 100 according to an embodiment, and FIG. 2 is a cross-sectional view illustrating the enlargement of a region II of FIG. 1.

Herein, a direction parallel to a main surface of the redistribution substrate 110 may be defined as the horizontal direction (the X direction and/or the Y direction), and a direction perpendicular to the horizontal direction (the X direction and/or the Y direction) may be defined as a vertical direction (a Z direction).

Referring to FIGS. 1 and 2, the semiconductor package 100 according to an embodiment may include a redistribution substrate 110, a first semiconductor chip 120, a second semiconductor chip 130, a third semiconductor chip 140, a heat dissipation chip 150, a heat dissipation connection unit 160, and a sealant 170.

The redistribution substrate 110 may be disposed under the semiconductor package 100. The redistribution substrate 110 may be disposed under the first semiconductor chip 120, the second semiconductor chip 130, and the sealant 170. The redistribution substrate 110 may redistribute a first chip pad 124 of the first semiconductor chip 120 to an external region of the first semiconductor chip 120. Also, the redistribution substrate 110 may redistribute a second chip pad 136 of the second semiconductor chip 130 to an external region of the second semiconductor chip 130.

The redistribution substrate 110 may include a redistribution insulation layer 112, a redistribution line 114, and a redistribution via 116. The redistribution insulation layer 112 may include an insulating material (for example, a photo imageable dielectric (PID) or a photo imageable polyimide (PIP), and may further include an inorganic filler. However, a material of the redistribution insulation layer 112 is not limited to materials described above. For example, the redistribution insulation layer 112 may include polyimide isoindro quirazorindione (PIQ), polyimide (PI), or polybenzoxazole (PBO).

The redistribution insulation layer 112 may have a multilayer structure, based on a multilayer structure of the redistribution line 114. All layers of the redistribution insulation layer 112 may include the same material, or at least one layer may include a different material.

The redistribution line 114 may be disposed as a multilayer in the redistribution insulation layer 112. Redistribution lines 114 disposed in different layers may be connected with each other by the redistribution via 116. The redistribution line 114 and the redistribution via 116 may include, for example, copper (Cu). However, a material of each of the redistribution line 114 and the redistribution via 116 is not limited to Cu.

An upper pad 118 may be disposed on an upper surface of an uppermost redistribution insulation layer 112. The upper pad 118 may be a separate element independent of the redistribution line 114. In other embodiments, the upper pad 118 may be provided as a portion of the redistribution line 114.

The upper pad 118 may be electrically connected with the redistribution line 114 and the redistribution via 116. Therefore, the upper pad 118 may electrically connect each of the first semiconductor chip 120 and the second semiconductor chip 130 with the redistribution substrate 110. The upper pad 118 may contact a first connector 125 and/or a second connector 137.

An external connection terminal 119 may be disposed on a lower surface of a lowermost redistribution insulation layer 112. The external connection terminal 119 may be disposed on a lower pad formed on the lower surface of the lowermost redistribution insulation layer 112. The lower pad may be referred to as an external connection pad. The external connection pad may be provided as a portion of the redistribution line 114. However, in an embodiment, the external connection pad may be provided as a separate element independent of the redistribution line 114.

The external connection terminal 119 may be electrically connected with the redistribution line 114 through the external connection pad. Therefore, the external connection terminal 119 may be electrically connected with the first semiconductor chip 120 through the redistribution line 114, the redistribution via 116, the upper pad 118, and the first connector 125 of the redistribution substrate 110. Also, the external connection terminal 119 may be electrically connected with the second semiconductor chip 130 through the redistribution line 114, the redistribution via 116, the upper pad 118, and the second connector 137 of the redistribution substrate 110. Also, the external connection terminal 119 may connect the semiconductor package 100 with a package substrate of an external system or a main board of an electronic device such as a mobile device. The external connection terminal 119 may include a conductive material, and for example, may include at least one of a solder, tin (Sn), silver (Ag), Cu, and aluminum (Ag). However, a material of the external connection terminal 119 is not limited to materials described above.

The external connection terminal 119 may be disposed in a region which is greater than the size of each of the first semiconductor chip 120 and the second semiconductor chip 130 in a horizontal direction (an X direction and/or a Y direction). As described above, a package structure where the external connection terminal 119 is disposed in a region which is greater than the size of each of the first semiconductor chip 120 and the second semiconductor chip 130 may be referred to as a fan-out (FO) package. A package structure where the external connection terminal 119 is disposed at only a portion corresponding to a lower surface of each of the first semiconductor chip 120 and the second semiconductor chip 130 may be referred to as a fan-in (FI) package structure.

Each of the first semiconductor chip 120 and the second semiconductor chip 130 may be disposed on the redistribution substrate 110. The first semiconductor chip 120 and the second semiconductor chip 130 may be spaced apart from each other in the horizontal direction (an X direction and/or a Y direction). The first semiconductor chip 120 may be mounted on the redistribution substrate 110 through the first connector 125, and the second semiconductor chip 130 may be mounted on the redistribution substrate 110 through the second connector 137. The first and second connectors 125 and 137 may each include a solder ball and/or a pillar. A pillar may include, for example, Cu. However, a material of the pillar is not limited to Cu.

The first semiconductor chip 120 may be an analog chip. The first semiconductor chip 120 may include a plurality of logic devices. Here, the logic devices may be devices for performing various signal processing, and for example, may include an AND gate, an OR gate, a NOT gate, and a flip-flop. The logic devices may include devices for supporting communication. In the semiconductor package 100 according to an embodiment, the first semiconductor chip 120 may be, for example, an application processor (AP) chip. The first semiconductor chip 120 may be referred to as a control chip, a process chip, or a central processing unit (CPU) chip based on a function thereof. Also, in terms of an integrated function, the first semiconductor chip 120 may be referred to as a system on chip (SoC). Furthermore, according to an embodiment, devices for supporting communication may be separately provided as another chip (for example, a modem chip) and may be disposed on the redistribution substrate 110 in a structure coupled to the first semiconductor chip 120.

The second semiconductor chip 130 may be, for example, a silicon (Si) chip. Devices or wirings may not be formed in the second semiconductor chip 130. Generally, the stiffness of Si may be higher than that of resin (for example, an epoxy mold compound (EMC)) included in the sealant 170. Therefore, the second semiconductor chip 130 may increase a resistance to warpage of the semiconductor package 100.

Although in FIG. 1 the semiconductor package 100 is illustrating including one second semiconductor chip 130, the semiconductor package 100 is not limited thereto and may include a plurality of second semiconductor chips 130. For example, in a plan view, the plurality of second semiconductor chips 130 may be adjacent to and surround the first semiconductor chip 120.

The first semiconductor chip 120 may include a first substrate 122 and a first chip pad 124. The second semiconductor chip 130 may include a second substrate 132, a through electrode 134, and a second chip pad 136. The first substrate 122 may include an active surface and an inactive surface, which are opposite to each other. In the first substrate 122, the active surface may be disposed adjacent to a lower surface of the first substrate 122, and the inactive surface may be disposed adjacent to an upper surface of the first substrate 122.

Each of the first substrate 122 and the second substrate 132 may include a semiconductor material, and for example, may include Group IV semiconductor material, Group III-V semiconductor material, Group II-VI semiconductor material, or a combination thereof. The Group IV semiconductor material may include, for example, Si, germanium (Ge), or a combination thereof. The Group III-V semiconductor material may include, for example, gallium arsenide (GaAs), indium phosphide (InP), gallium phosphide (GaP), indium arsenide (InAs), indium antimony (InSb), indium gallium arsenide (InGaAs), or a combination thereof. The Group II-VI semiconductor material may include, for example, zinc tellurium (ZnTe), cadmium sulfur (CdS), or a combination thereof.

The first and second chip pads 124 and 136 may be respectively disposed on lower surfaces of the first substrate 122 and the second substrate 132 and may respectively extend along the lower surfaces of the first substrate 122 and the second substrate 132. Also, the first connector 125 may be disposed between the first semiconductor chip 120 and the redistribution substrate 110, and the second connector 127 may be disposed between the second semiconductor chip 130 and the redistribution substrate 110.

The through electrode 134 may be a through silicon via (TSV) passing through Si of the second semiconductor chip 130. The through electrode 134 may pass through at least a portion of the second substrate 132 of the second semiconductor chip 130 in the vertical direction (the Z direction). The through electrode 134 may electrically connect the redistribution substrate 110 with the third semiconductor chip 140. The through electrode 134 may electrically connect the second chip pad 136 of the second semiconductor chip 130 with the third connector 145. For example, a lower surface of the through electrode 134 may contact the second chip pad 136, and an upper surface of the through electrode 134 may contact the third connector 145.

The third semiconductor chip 140 may be disposed on the second semiconductor chip 130. The third semiconductor chip 140 may be disposed on the second semiconductor chip 130 through the third connector 145. The third semiconductor chip 140 may be a memory chip. Therefore, the third semiconductor chip 140 may include a plurality of memory devices. The third semiconductor chip 140 may include, for example, a volatile memory device such as dynamic random access memory (DRAM) or static random access memory (SRAM) or a non-volatile memory device such as flash memory. In the semiconductor package 100 according to an embodiment, the third semiconductor chip 140 may include, for example, a DRAM device.

In some embodiments, the third semiconductor chip 140 may be stacked on the second semiconductor chip 130 on which a memory device, having a package structure where a plurality of memory chips are stacked, is stacked. As described above, in a case where a memory device having a package structure is stacked on the second semiconductor chip 130, all semiconductor packages may correspond to a package on package (POP) structure. A semiconductor package having the POP structure will be described below in more detail in describing FIG. 4.

The third connector 145 may be disposed between the second semiconductor chip 130 and the third semiconductor chip 140. The third connector 145 may be disposed between a third chip pad of the third semiconductor chip 140 and an upper surface of the through electrode 134 corresponding thereto. According to an embodiment, a pad may be formed on the through electrode 134, and the third connector 145 may be disposed between the third chip pad and the pad corresponding thereto. The third connector 145 may include a solder ball and/or a pillar. Furthermore, an underfill UF may be filled between the third semiconductor chip 140 and the sealant 170. According to an embodiment, the underfill UF may be omitted.

The heat dissipation chip 150 may be disposed on the first semiconductor chip 120. The heat dissipation chip 150 may be stacked on the first semiconductor chip 120 through the heat dissipation connection unit 160. The heat dissipation chip 150 may be, for example, Si. Devices or wirings may not be formed in the heat dissipation chip 150. Generally, a thermal conductance of Si may be higher than that of resin (for example, an EMC) included in the sealant 170. Accordingly, the heat dissipation chip 150 may more efficiently dissipate heat occurring in the first semiconductor chip 120.

The heat dissipation connector 160 may be disposed between the first semiconductor chip 120 and the heat dissipation chip 150. The heat dissipation connector 160 may include a metal pad 162 and an adhesive layer 164. The metal pad 162 may be disposed on a lower surface of the heat dissipation chip 150 and may include metal having a high thermal conductance. For example, the metal pad 162 may include Cu, nickel (Ni), aluminum (Al), Sn, gold (Au), or Ag. However, a material of the metal pad 162 is not limited to describe above. Furthermore, according to an embodiment, the heat dissipation chip 150 may include a passivation layer on a lower surface thereof, and the metal pad 162 may be disposed on a lower surface of the heat dissipation chip 150 in a type passing through the passivation layer. The passivation layer may include, for example, silicon oxide or silicon nitride.

The adhesive layer 164 may attach and fix the heat dissipation chip 150 on and to the first semiconductor chip 120. As illustrated in FIG. 1, the adhesive layer 164 may cover the metal pad 162, on a lower surface of the heat dissipation chip 150, and may slightly protrude from a side surface of the heat dissipation chip 150. The adhesive layer 164 may include a material having a high thermal conductance, so as to more efficiently transfer heat from the first semiconductor chip 120 to the metal pad 162 and the heat dissipation chip 150. For example, the adhesive layer 164 may include a thermal interface material (TIM), thermal conductive resin, a thermal conductive polymer, or silicon oxide or silicon nitride such as $SiO_2$ or SiCN. Here, the TIM may include a material having a relatively high thermal conductance, and for example, may include grease, tape, an elastomer filling pad, or a phase transition material, which is a material having a low thermal resistance.

As illustrated in FIG. 2, the metal pad 162 may maintain a gap G which is apart from the first semiconductor chip 120 in the vertical direction (the Z direction). For example, the gap G may be between a lower surface of the metal pad 162 and an upper surface of the first semiconductor chip 120, and the adhesive layer 164 may be disposed in the gap G. In the semiconductor package 100 according to an embodiment, the gap G may be, for example, 1 μm or less. As described above, the metal pad 162 and the first semiconductor chip 120 may maintain the gap G and the adhesive layer 164 may be disposed in the gap G, and thus, stress caused by the coefficient difference of thermal expansion between the metal pad 162 and the first semiconductor chip 120 may be reduced, thereby preventing warpage. According to an embodiment, the lower surface of the metal pad 162 may contact the upper surface of the first semiconductor chip 120.

The sealant 170 may be disposed between the redistribution substrate 110 and the third semiconductor chip 140 and may be disposed between the redistribution substrate 110 and the heat dissipation chip 150. The sealant 170 may expose the upper surface of the first semiconductor chip 120 and/or the second semiconductor chip 130. The sealant 170 may cover and seal side surfaces of the first semiconductor chip 120 and the second semiconductor chip 130. As illustrated in FIG. 1, the sealant 170 may cover and seal the first connector 125 and the second connector 137. In other embodiments, the underfill UF covering the first connector 125 and/or the second connector 137 may be filled, and the sealant 170 may cover a sider surface of the underfill UF.

Also, an upper surface of the sealant 170 may be at the same vertical level as each of the upper surface of the first semiconductor chip 120 and the upper surface of the second semiconductor chip 130 or horizontally aligned with the upper surface of the first semiconductor chip 120 and the upper surface of the second semiconductor chip 130. For example, the upper surface of the first semiconductor chip 120 and the upper surface of the second semiconductor chip 130 may not be sealed by the sealant 170.

The sealant 170 may include an insulating material, and for example, may include thermo-curable resin such as epoxy resin, thermo-plastic resin such as polyimide, or resin where a stiffener such as an inorganic filler is included therein. For example, the sealant 170 may include Ajinomoto build-up film (ABF), frame retardant 4 (FR-4), or bismaleimide triazine (BT) resin. Also, the sealant 170 may include a molding material such as EMC or a photosensitive material such as photo imageable encapsulant (PIE). However, a material of the sealant 170 is not limited to materials described above.

A position relationship and one-dimensional sizes of the redistribution substrate 110, the first to third semiconductor chips 120 to 140, and the heat dissipation chip 150, the redistribution substrate 110 may one-dimensionally have substantially the same size as that of the sealant 170. Therefore, in a plan view, the first semiconductor chip 120 and the second semiconductor chip 130 may be disposed in the redistribution substrate 110. Also, in a plan view, the third semiconductor chip 140 and the heat dissipation chip 150 each disposed on the first semiconductor chip 120 and the second semiconductor chip 130 may be disposed in the redistribution substrate 110. The third semiconductor chip 140 and the heat dissipation chip 150 may be spaced apart from each other in the horizontal direction (the X direction and/or the Y direction), on the sealant 170.

The first semiconductor chip 120 may overlap the heat dissipation chip 150 in the vertical direction (the Z direction), and the second semiconductor chip 130 may overlap the third semiconductor chip 140 in the vertical direction (the Z direction). In a plan view, the first semiconductor chip 120 and the third semiconductor chip 140 may be disposed apart from each other in the horizontal direction (the X direction and/or the Y direction), and the second semiconductor chip 130 and the heat dissipation chip 150 may be disposed apart from each other in the horizontal direction (the X direction and/or the Y direction).

In the semiconductor package 100 according to an embodiment, the first semiconductor chip 120 and the second semiconductor chip 130 may be self-aligned and disposed on the redistribution substrate 110. Therefore, the redistribution line 114 of the redistribution substrate 110 may include a fine line and space L/S. For example, the uppermost redistribution line 114 connected with the first connector 125 of the first semiconductor chip 120 may have a line width and interval of 2/2 μm. Also, redistribution lines 114 under the uppermost redistribution line 114 may have, for example, a line width and interval of 7/8 μm. A method of self-aligning the first semiconductor chip 120 and the second semiconductor chip 130 will be described in more detail in describing a method of manufacturing a semiconductor package illustrated in FIGS. 16 to 20.

Figure 3:
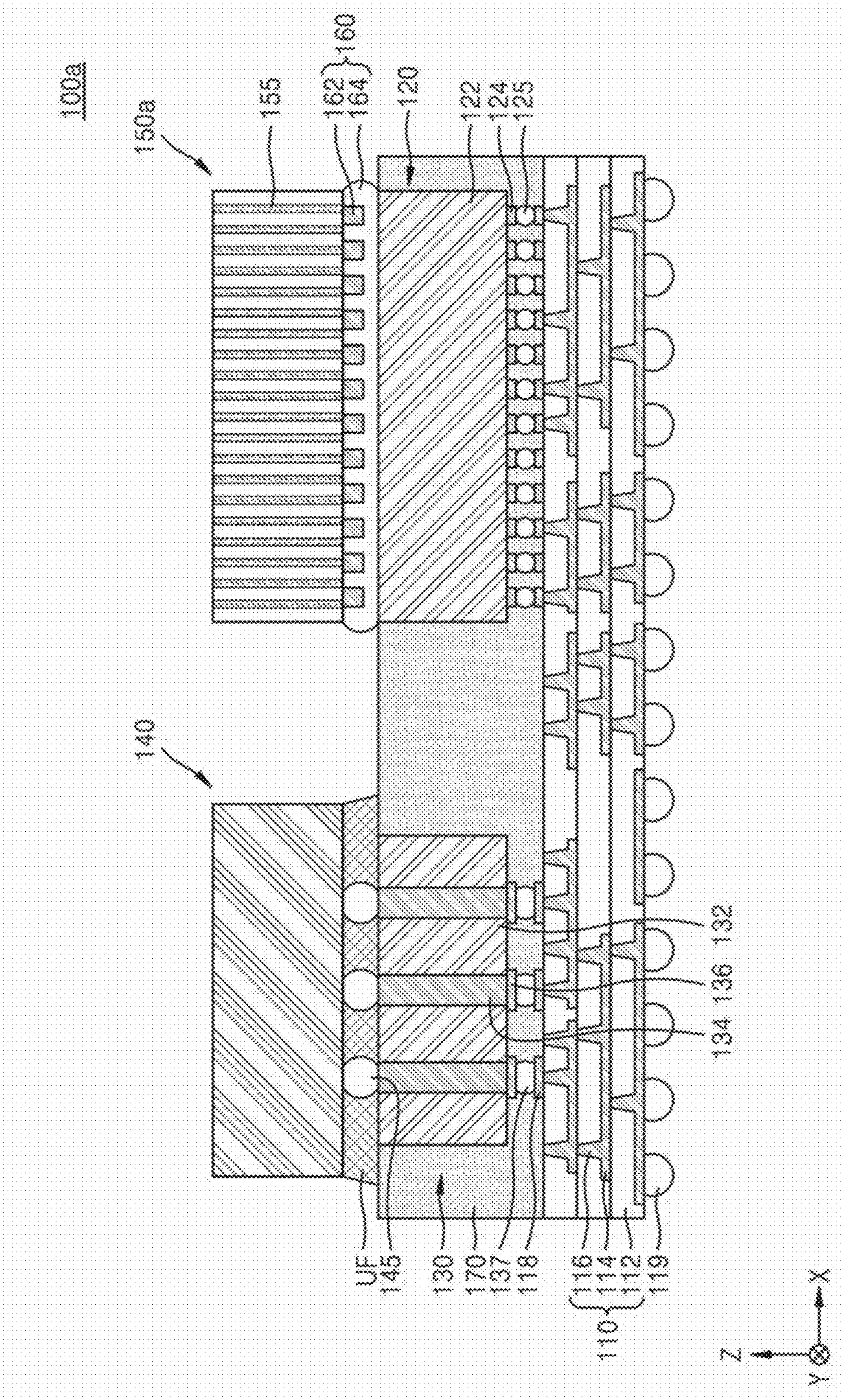
FIG. 3 is a cross-sectional view of a semiconductor package according to an embodiment.

FIG. 3 is a cross-sectional view of a semiconductor package 100*a* according to an embodiment. Descriptions which are the same as or similar to the descriptions of FIGS. 1 and 2 will be briefly given or are omitted.

Referring to FIG. 3, the semiconductor package 100*a* may include a redistribution substrate 110, a first semiconductor chip 120, a second semiconductor chip 130, a third semiconductor chip 140, a heat dissipation chip 150*a*, a heat dissipation connector 160, and a sealant 170. The redistribution substrate 110, the first semiconductor chip 120, the second semiconductor chip 130, the third semiconductor chip 140, the heat dissipation connector 160, and the sealant 170 of the semiconductor package 100*a* of FIG. 3 may be substantially the same as the redistribution substrate 110, the first semiconductor chip 120, the second semiconductor chip 130, the third semiconductor chip 140, the heat dissipation connector 160, and the sealant 170 of the semiconductor package 100 of FIG. 1, respectively, and thus, the heat dissipation chip 150*a* will be mainly described below.

The heat dissipation chip 150*a* may include a plurality of metal lines 155 which pass through at least a portion of the heat dissipation chip 150*a* in a vertical direction (a Z direction). The metal line 155 may include metal having a high thermal conductance. For example, the metal line 155 may include Cu, Ni, Al, Sn, Au, or Ag. However, a material of the metal line 155 is not limited to describe above.

The metal line 155 may be higher in thermal conductance than Si of the heat dissipation chip 150*a* and may thus more efficiently dissipate heat from the first semiconductor chip 120 to the outside of the semiconductor package 100*a*. The metal line 155 may be connected with a metal pad 162 disposed under the heat dissipation chip 150*a*. However, at least a portion of the metal line 155 may not be connected with the metal pad 162.

Figure 4:
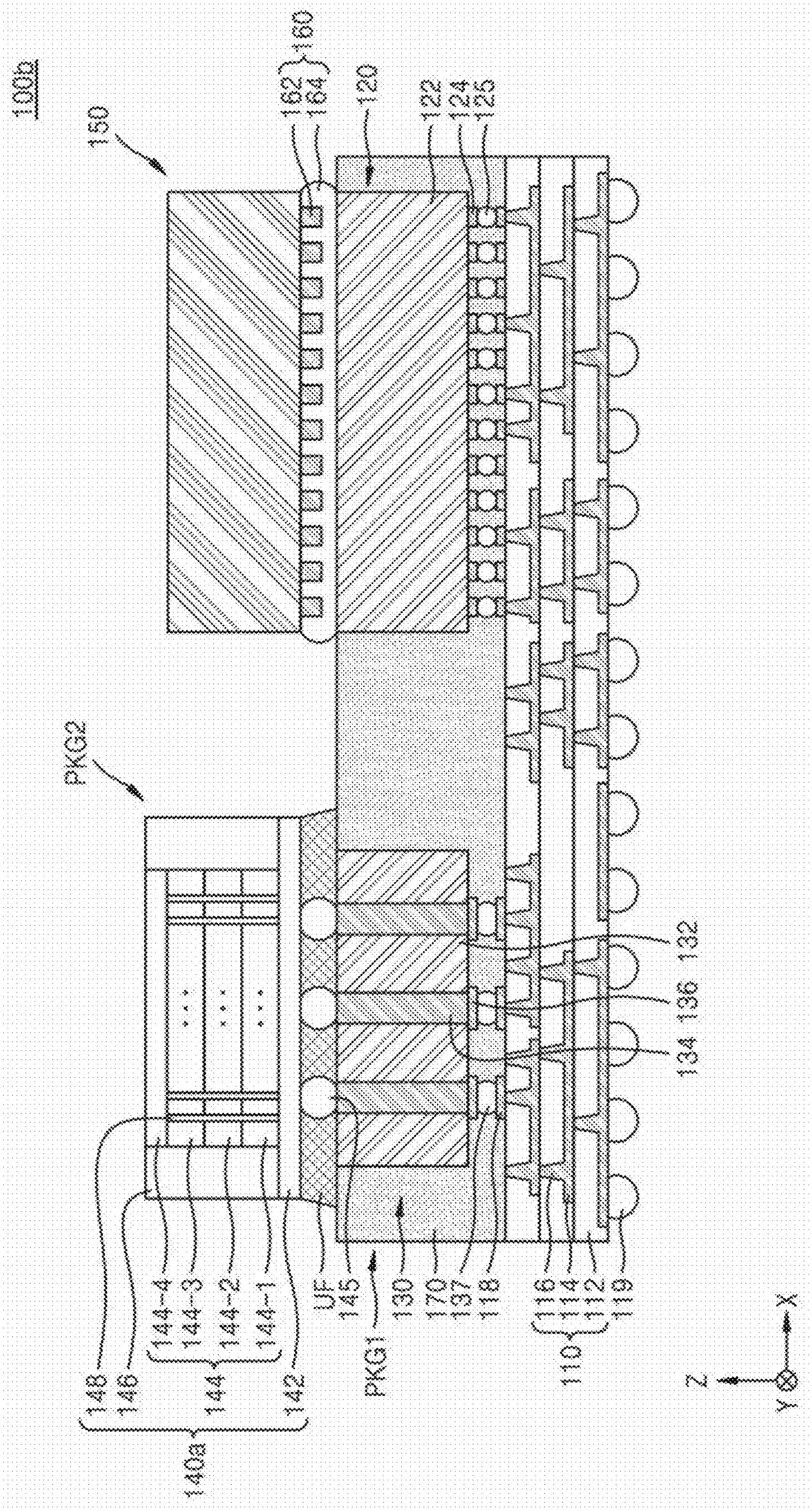
FIG. 4 is a cross-sectional view of a semiconductor package according to an embodiment.

FIG. 4 is a cross-sectional view of a semiconductor package 100*b* according to an embodiment. The semiconductor package 100*b* will be described with reference to FIG. 4 in conjunction with FIGS. 1 to 3.

Referring to FIG. 4, the semiconductor package 100*b* may include a redistribution substrate 110, a first semiconductor chip 120, a second semiconductor chip 130, a memory device 140*a*, a heat dissipation chip 150, a heat dissipation connector 160, and a sealant 170. The redistribution substrate 110, the first semiconductor chip 120, the second semiconductor chip 130, the heat dissipation chip 150, the heat dissipation connector 160, and the sealant 170 of the semiconductor package 100*b* of FIG. 4 may be substantially the same as the redistribution substrate 110, the first semiconductor chip 120, the second semiconductor chip 130, the heat dissipation chip 150, the heat dissipation connector 160, and the sealant 170 of the semiconductor package 100 of FIG. 1, respectively, and thus, the memory device 140*a* will be mainly described below.

The memory device 140*a* may be disposed on the second semiconductor chip 130. The memory device 140*a* may be electrically connected with the redistribution substrate 110 through a through electrode 134 of the second semiconductor chip 130. For example, the memory device 140*a* may be a high bandwidth memory (HBM) package. To provide a more detailed description, the memory device 140*a*, which is an HBM package, may include a base chip 142, a plurality of core chips 144, an internal sealant 146, and a memory device through electrode 148.

The base chip 142 may include logic devices. Therefore, the base chip 142 may be a logic chip. The base chip 142 may be disposed under the core chips 144 and may integrated and transfer signals of the core chips 144 to the outside, and moreover, may transfer a signal and power from the outside to the core chips 144. Therefore, the base chip 142 may be referred to as a buffer chip or a control chip. Furthermore, each of the core chips 144 may be a memory chip. For example, each of the core chips 144 may be a DRAM chip. Also, the core chip 144 may be stacked on the base chip 142 or a lower core chip 144 through pad-to-pad bonding, hybrid bonding (HB), bonding using a bonding member, or bonding using an anisotropic conductive film (ACF). In FIG. 4, a case where four core chips 144 are stacked on the base chip 142 is illustrated, but the number of core chips 144 is not limited to four. For example, three or less core chips 144 or five or more core chips 144 may be stacked on the base chip 142.

The core chips 144 on the base chip 142 may be sealed by the internal sealant 146. However, an uppermost core chip 144 of the core chips 144 may not be covered by the internal sealant 146. In other embodiments, an upper surface of the uppermost core chip 144 may be covered by the internal sealant 146.

The base chip 142 and the core chips 144 may include a memory device through electrode 148. Here, the memory device through electrode 148 may be a TSV. As illustrated in FIG. 4, the uppermost core chip 144 of the core chips 144 may not include the memory device through electrode 148. Furthermore, a micro-bump and an adhesive layer may be disposed between the base chip 142 and the core chip 144 and between adjacent core chips 144. Also, the micro-bump may be electrically connected with the memory device through electrode 148.

In the semiconductor package 100*b* according to an embodiment, the memory device 140*a* is not limited to the HBM package. For example, the memory device 140*a* may have a general package structure. For example, the memory device 140*a* may include an upper package substrate and a plurality of memory chips stacked on the upper package substrate. The upper package substrate may be disposed on the second semiconductor chip 130 through the third connector 145. Also, the memory chips may be stacked on the upper package substrate through a bonding wire or may be stacked on the upper package substrate through a bump and a TSV.

The semiconductor package 100*b* according to an embodiment may have a POP structure. In detail, the redistribution substrate 110, the first semiconductor chip 120, the second semiconductor chip 130, and the sealant 170 may configure a first package PKG1, and the memory device 140*a* may configure a second package PKG2. Accordingly, the semiconductor package 100*b* according to an embodiment may have a POP structure where the second package PKG2 is stacked on the first package PKG1 through the third connector 145.

Figure 5:
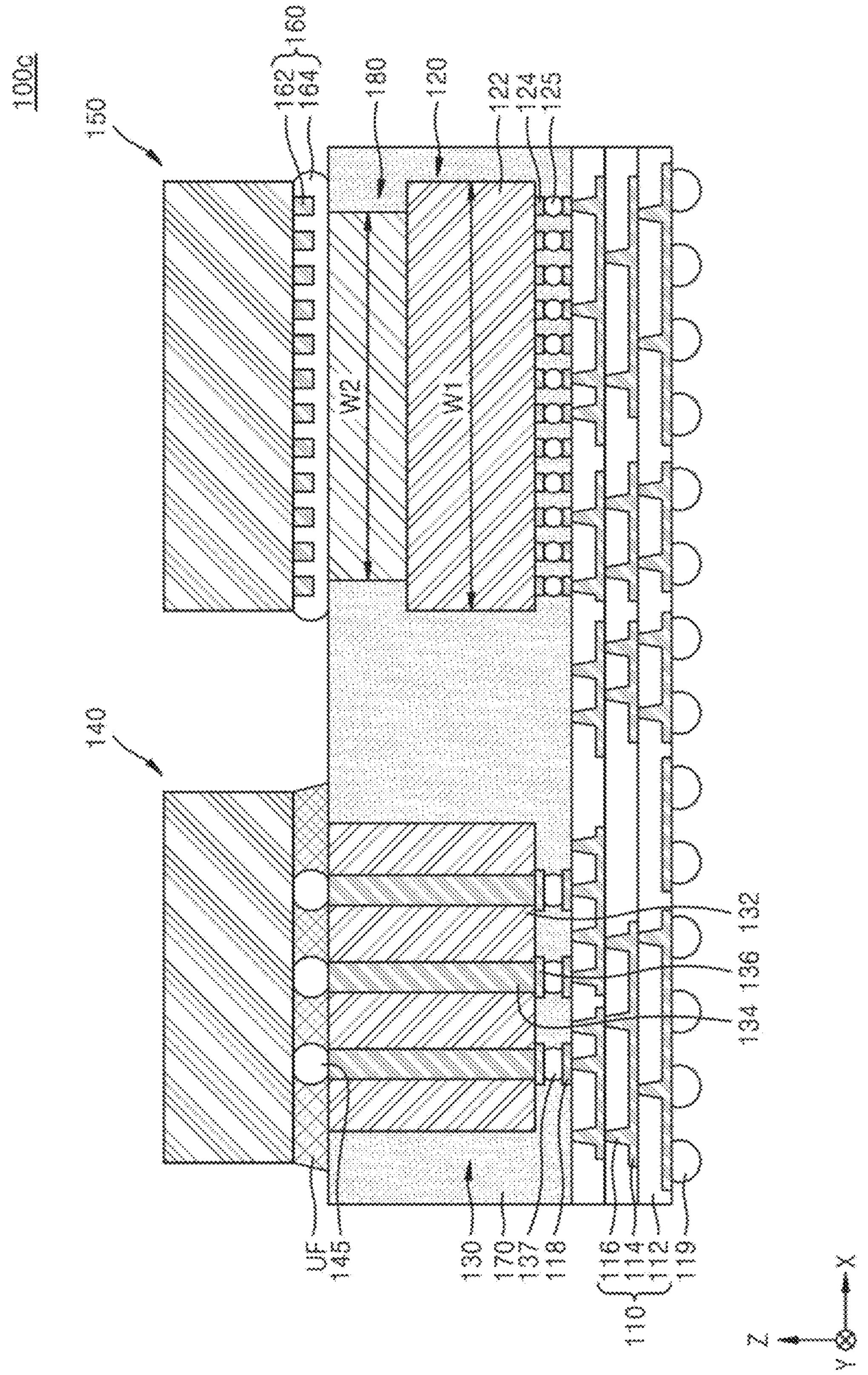
FIG. 5 is a cross-sectional view of a semiconductor package according to an embodiment.

FIG. 5 is a cross-sectional view of a semiconductor package 100*c* according to an embodiment. The semiconductor package 100*c* will be described with reference to FIG. 5 in conjunction with FIGS. 1 to 4.

Referring to FIG. 5, the semiconductor package 100*c* may further include a fourth semiconductor chip 180. The fourth semiconductor chip 180 may be disposed between a first semiconductor chip 120 and a heat dissipation connector 160. The fourth semiconductor chip 180 may be, for example, an AP chip. The fourth semiconductor chip 180 may be referred to as a control chip, a process chip, or a CPU chip based on a function thereof. In other embodiments, the fourth semiconductor chip 180 may be a modem chip which supports communication of the first semiconductor chip 120.

The fourth semiconductor chip 180 may be stacked on the first semiconductor chip 120 through bonding using a bump, bonding using ACF, or HB. For reference, the HB may denote bonding where pad-to-pad bonding and insulator-to-insulator bonding are combined. The ACF may be an anisotropic conductive layer which allows electricity to flow in only one direction and may denote a conductive layer which is formed in a film state by combining a micro conductive particle with adhesive resin.

In FIG. 5, it is illustrated that a first width W1, which is a horizontal width of the first semiconductor chip 120, is greater than a second width W2, which is a horizontal width of the fourth semiconductor chip 180, but the second width W2 may be greater than or equal to the first width W1.

Also, an upper surface of the sealant 170 may be at the same vertical level as each of an upper surface of the second semiconductor chip 130 and an upper surface of the fourth semiconductor chip 180 or horizontally aligned with an upper surface of the second semiconductor chip 130 and an upper surface of the fourth semiconductor chip 180. For example, the upper surface of the second semiconductor chip 130 and the upper surface of the fourth semiconductor chip 180 may not be sealed by the sealant 170.

Figure 6:
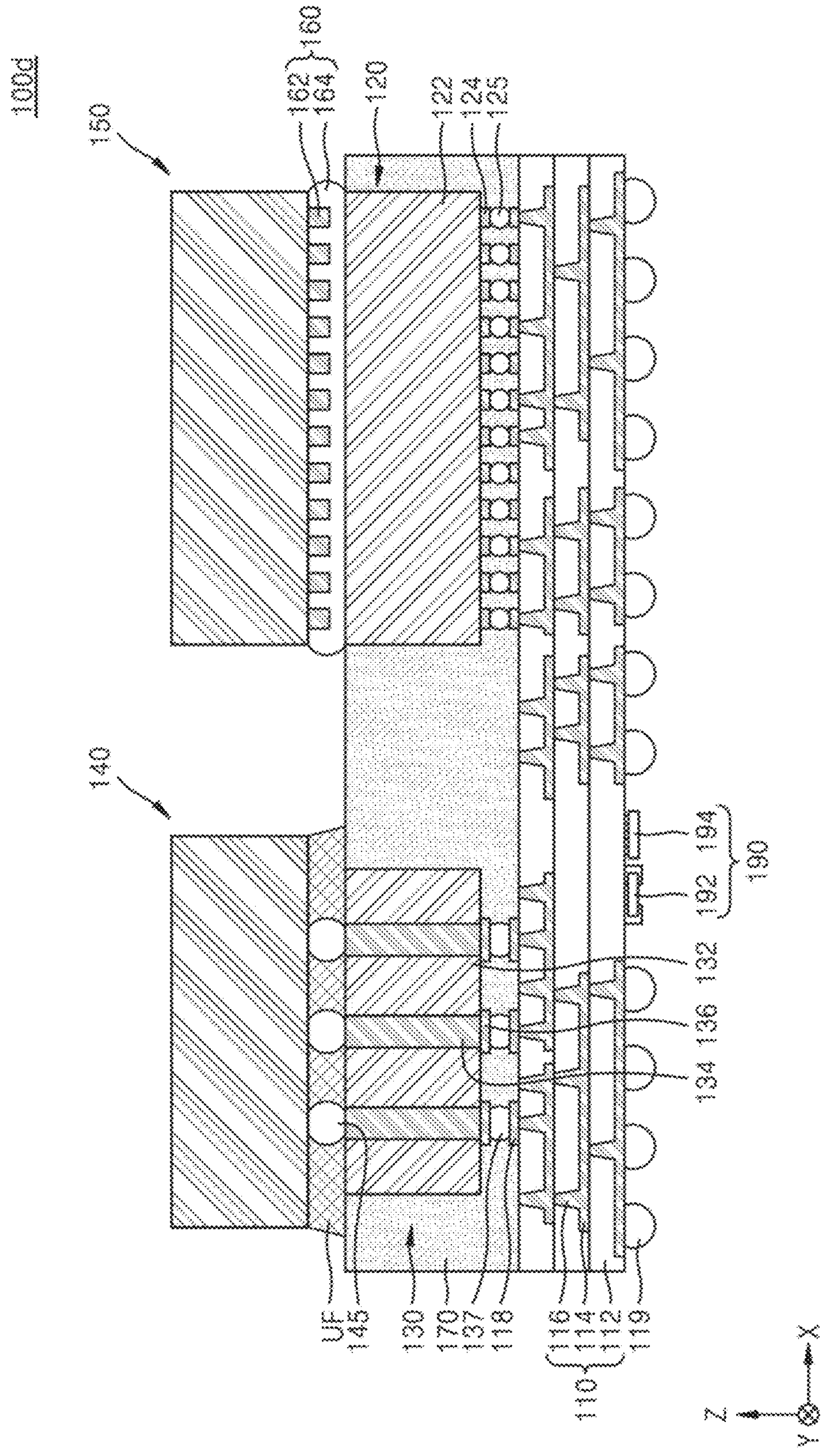
FIG. 6 is a cross-sectional view of a semiconductor package according to an embodiment.

FIG. 6 is a cross-sectional view of a semiconductor package 100*d* according to an embodiment. The semiconductor package 100*d* will be described with reference to FIG. 6 in conjunction with FIGS. 1 to 5.

Referring to FIG. 6, the semiconductor package 100*d* may further include a passive device 190. The passive device 190 may be disposed on a lower surface of a redistribution substrate 110. However, according to an embodiment, the passive device 190 may be disposed on an upper surface of the redistribution substrate 110 or may be disposed in the redistribution substrate 110. The passive device 190 may include a 2-step element such as a resistor, an inductor, or a capacitor. In the semiconductor package 100*d* according to an embodiment, the passive device 190 may include a multi-layer ceramic capacitor (MLCC) 192 and a Si-capacitor 194.

Figure 7:
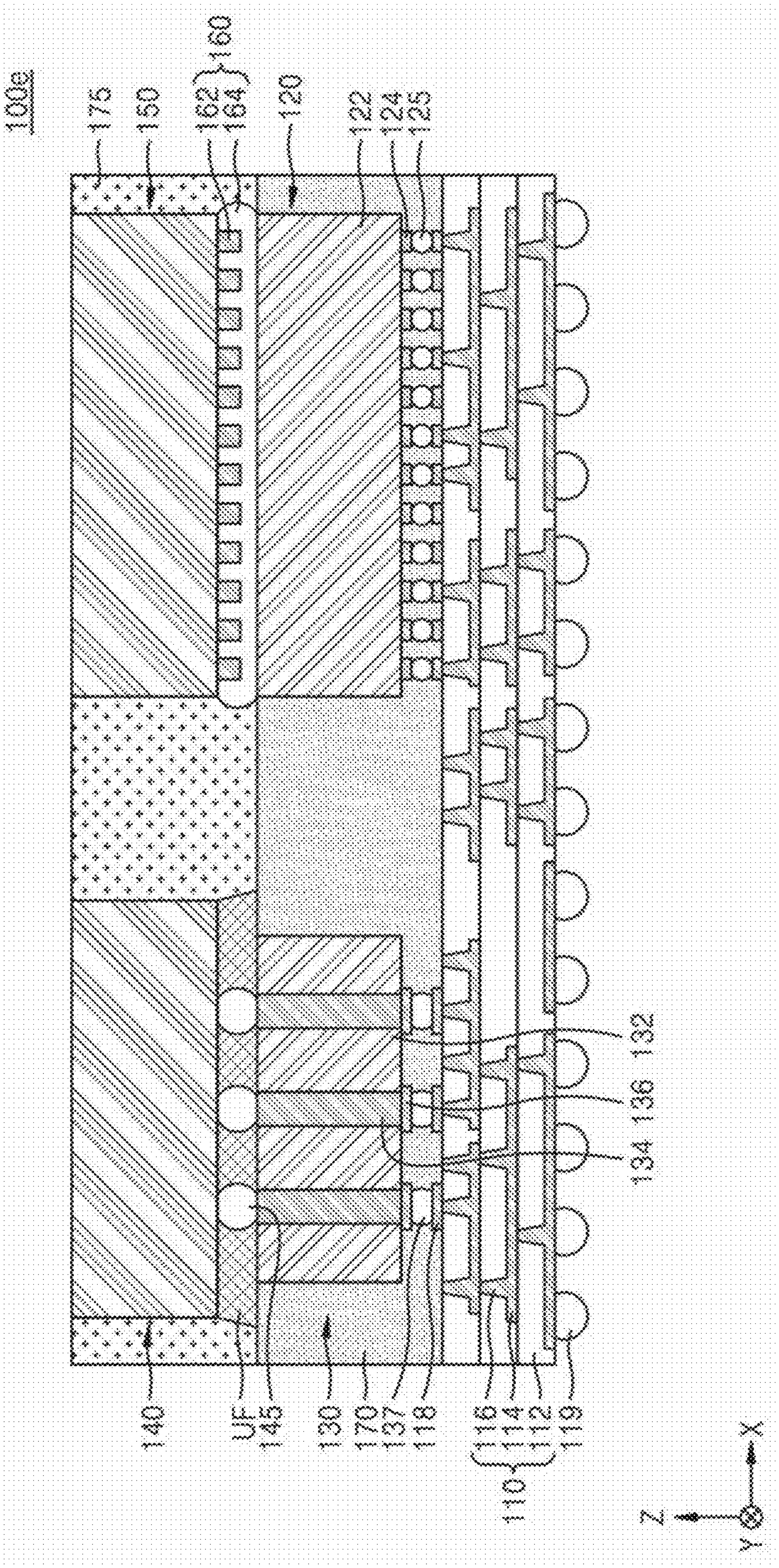
FIG. 7 is a cross-sectional view of a semiconductor package according to an embodiment.

FIG. 7 is a cross-sectional view of a semiconductor package 100*e* according to an embodiment. The semiconductor package 100*e* will be described with reference to FIG. 7 in conjunction with FIGS. 1 to 6.

Referring to FIG. 7, the semiconductor package 100*e* may include an upper sealant 175 which seals side surfaces of a third semiconductor chip 140 and a heat dissipation chip 150. The upper sealant 175 may be substantially the same as the upper sealant 170.

The upper sealant 175 may not cover an upper surface of the third semiconductor chip 130 and an upper surface of the heat dissipation chip 150. In other embodiments, the upper sealant 175 may cover the upper surface of the third semiconductor chip 130 and/or the upper surface of the heat dissipation chip 150. In this case, the upper surface of the third semiconductor chip 140 may be at a vertical level which is lower than the upper surface of the heat dissipation chip 150.

Figure 8:
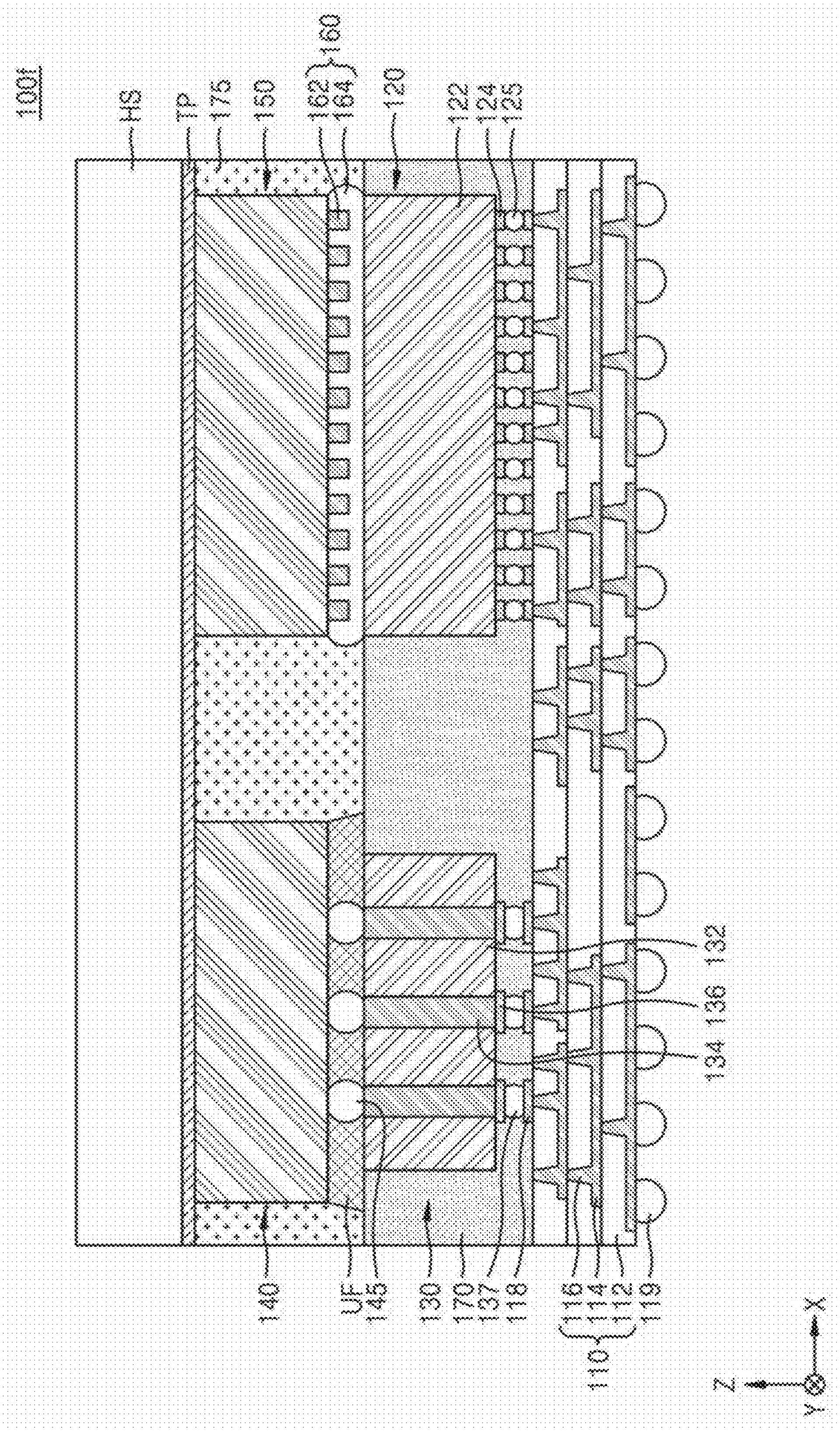
FIG. 8 is a cross-sectional view of a semiconductor package according to an embodiment.

FIG. 8 is a cross-sectional view of a semiconductor package 100*f* according to an embodiment. The semiconductor package 100*f* will be described with reference to FIG. 8 in conjunction with FIGS. 1 to 7.

Referring to FIG. 8, the semiconductor package 100*f* may further include an upper sealant 175, an adhesive layer TP, and a heat dissipation structure HS. The adhesive layer TP may be disposed on the upper sealant 175, and the heat dissipation structure HS may be disposed on the adhesive layer TP. The heat dissipation structure HS may be stacked on the upper sealant 175 through the adhesive layer TP. The adhesive layer TP may include a material having a relatively high thermal conductance, and for example, may include a TIM or thermal conductive resin. The heat dissipation structure HS may include, for example, a heat sink or a heat slug.

FIGS. 9 to 15 are cross-sectional views illustrating a method of manufacturing a semiconductor package, according to an embodiment. The method will be described with reference to FIGS. 9 to 15 in conjunction with FIG. 1. FIGS. 9 to 15 illustrate a chip-last manufacturing method which manufactures a redistribution substrate 110 prior to first semiconductor chip 120 and the second semiconductor chip 130.

Figure 9:
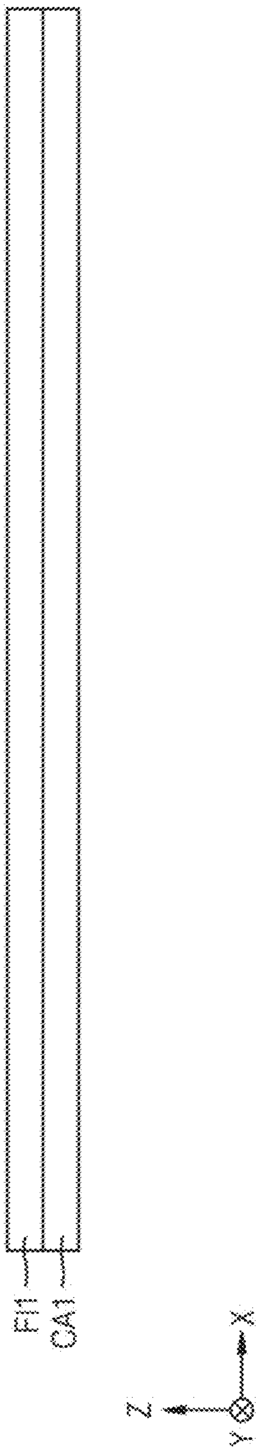
FIGS. 9, 10, 11, 12, 13, 14, and 15 are cross-sectional views illustrating a method of manufacturing a semiconductor package, according to an embodiment.

Referring to FIG. 9, a first adhesive film FI1 may be attached on a first carrier substrate CA1. For example, the first carrier substrate CA1 may include Si. The first adhesive film FI1 may include an arbitrary material which may fix the redistribution substrate 110. For example, the first adhesive film FI1 may be a thermo-curable adhesive tape where an adhesive force is weakened by thermal treatment or may be an ultraviolet (UV)-curable adhesive tape where an adhesive force is weakened by UV irradiation.

Figure 10:
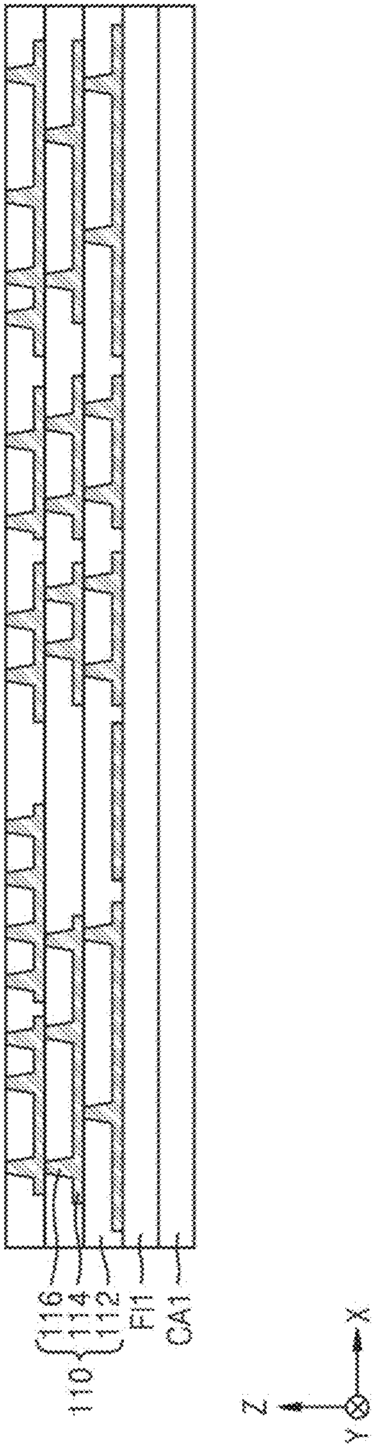

Referring to FIG. 10, the redistribution substrate 110 may be formed on the first adhesive film FI1. The redistribution substrate 110 may include a redistribution insulation layer 112, a redistribution line 114, and a redistribution via 116.

One or more redistribution insulation layers 112 may be stacked in a vertical direction (a Z direction). The redistribution line 114 may extend in a horizontal direction (an X direction and/or a Y direction) in the redistribution insulation layer 112. The redistribution via 116 may extend in the vertical direction (the Z direction) in the redistribution insulation layer 112 and may be electrically connected with at least one redistribution line 114.

First, a lowermost conductive line pattern may be formed, and then, a preliminary lowermost redistribution insulation layer covering the lowermost conductive line pattern may be formed. Subsequently, at least a portion of the preliminary lowermost redistribution insulation layer may be removed by performing an exposure process, and thus, a lowermost redistribution insulation layer 112 including a via hole may be formed. A base redistribution conductive layer may be formed on the lowermost redistribution insulation layer 112, and then, by patterning the base redistribution conductive layer, a base conductive pattern including redistribution vias 116 and the redistribution line 114 may be formed. Subsequently, by repeatedly forming the redistribution insulation layer 112 and the conductive patterns, the redistribution substrate 110 may be formed.

Figure 11:
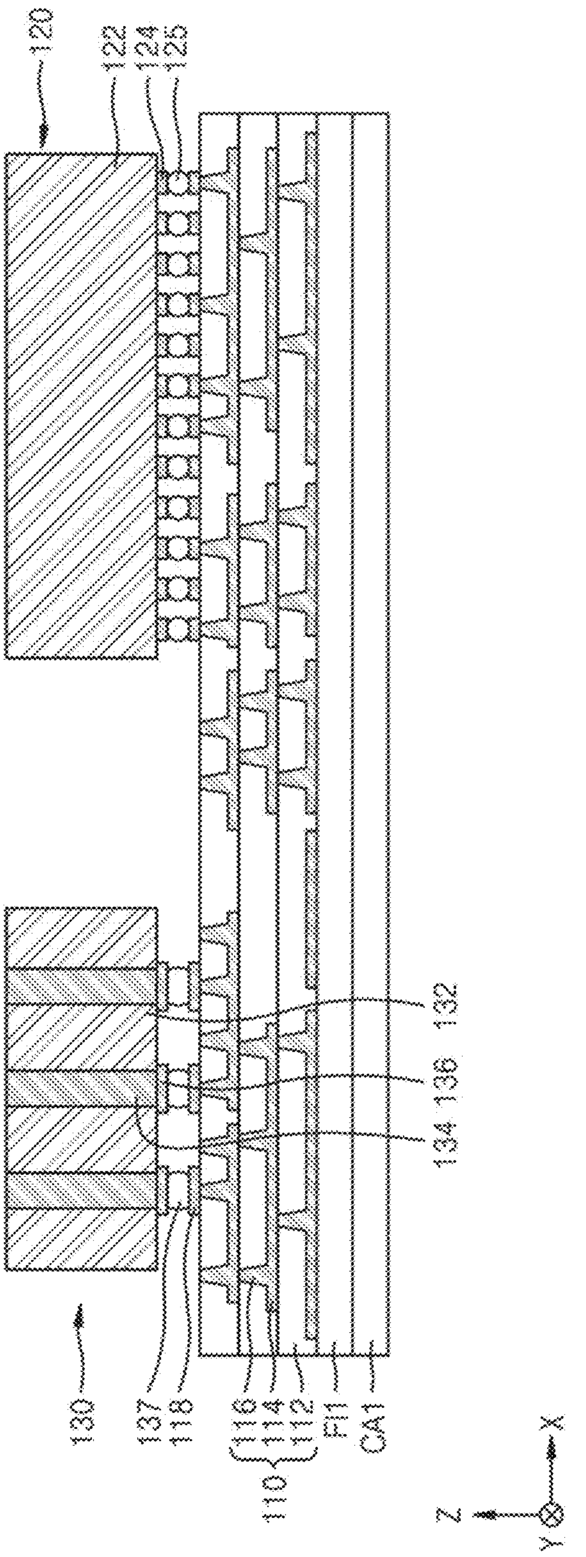

Referring to FIG. 11, an upper pad 118 may be formed on the redistribution substrate 110, and a first semiconductor chip 120 and a second semiconductor chip 130 may be disposed on the redistribution substrate 110. The first semiconductor chip 120 may be connected with the redistribution substrate 110 through a first connector 125, and the second semiconductor chip 130 may be connected with the redistribution substrate 110 through a second connector 137.

The first connector 125 and/or the second connector 137 may be self-aligned and connected with the upper pad 118. Therefore, the first connector 125 and/or the second connector 137 may be relatively very small. Based thereon, redistribution lines 114 of the redistribution substrate 110 may be formed to have a relatively fine width and interval. For example, redistribution lines 114 coupled to the first connector 125 of the first semiconductor chip 120 among the redistribution lines 114 of the redistribution substrate 110 may have a line width and interval of 2/2 μm.

Figure 12:
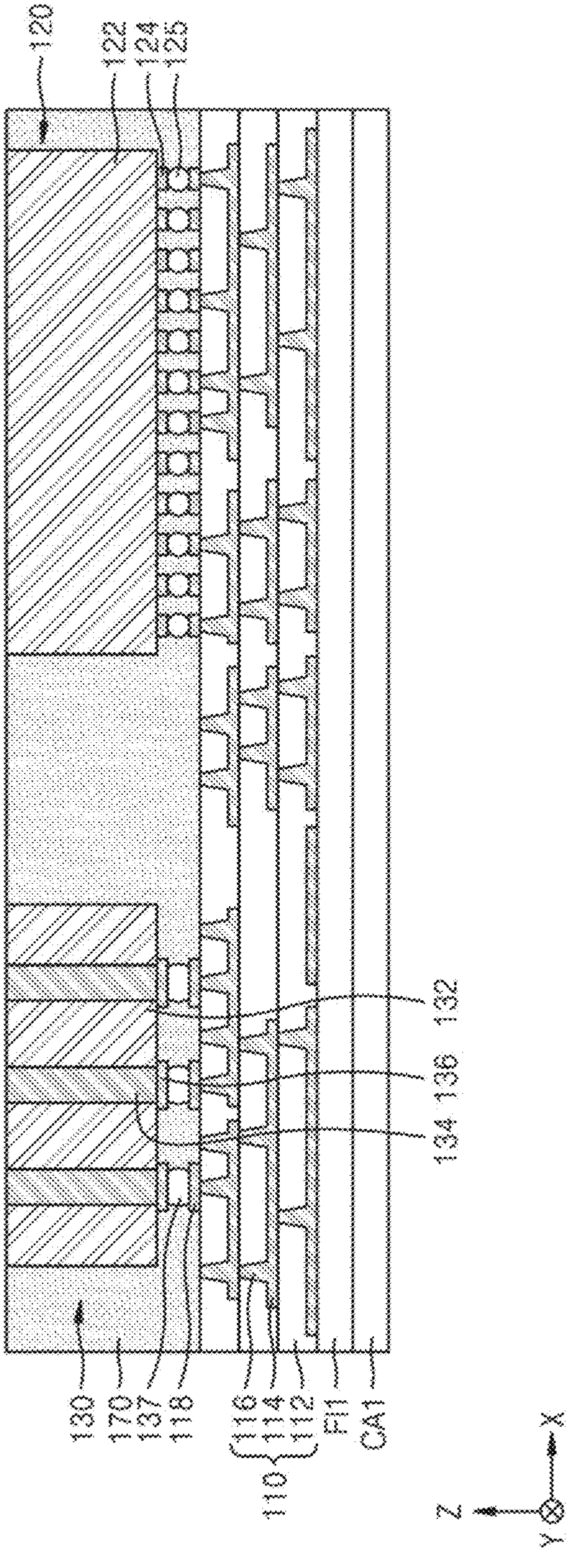

Referring to FIG. 12, a molding material covering the first semiconductor chip 120 and the third semiconductor chip 130 may be formed on the redistribution substrate 110, and a sealant 170 may be formed by removing at least a portion of the molding material. For example, the molding material may be ground and may thus be removed. The molding material may be supplied onto the redistribution substrate 110 and may then be cured. An upper surface of the sealant 170 may be at the same vertical level as each of an upper surface of the first semiconductor chip 120 and an upper surface of the second semiconductor chip 130 or horizontally aligned with an upper surface of the first semiconductor chip 120 and an upper surface of the second semiconductor chip 130.

Figure 13:
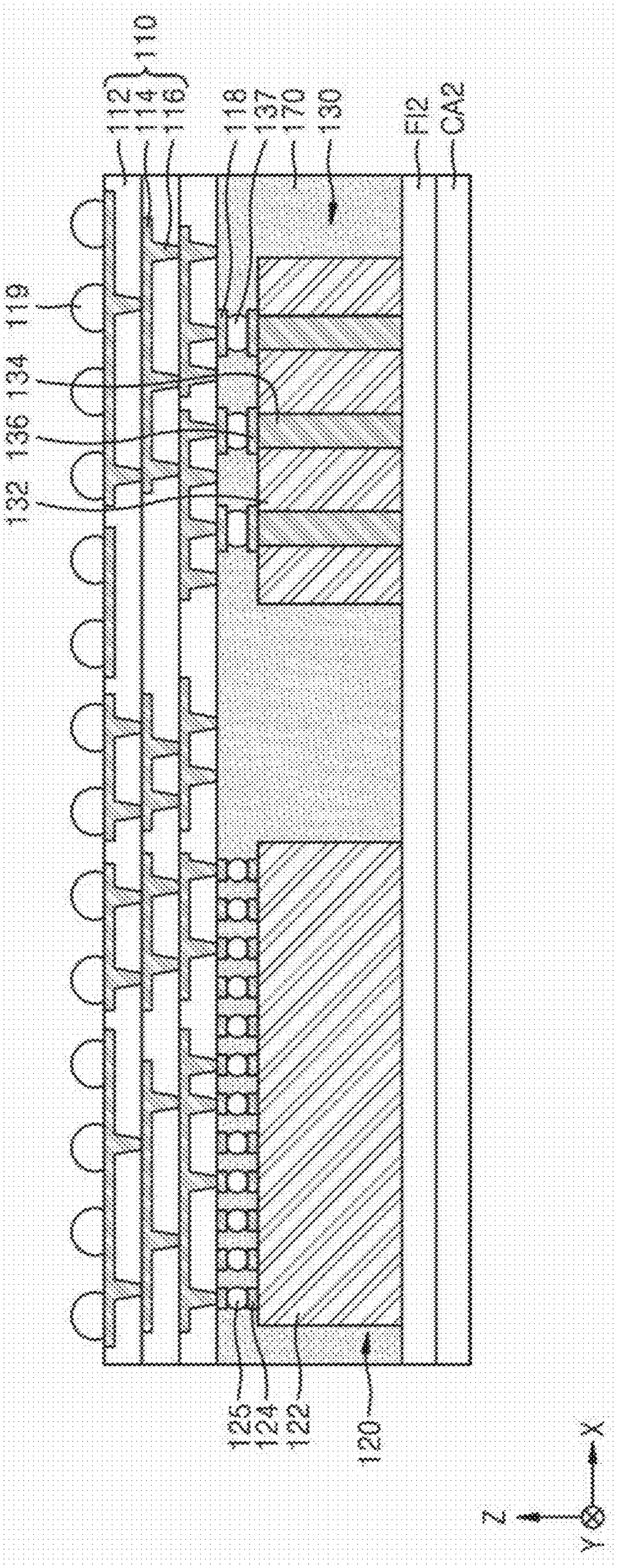

Referring to FIG. 13, a second carrier substrate CA2 and a second adhesive film FI2 may be attached on the sealant 170, and the whole structure may be reversed so that the redistribution substrate 110 is disposed upward and the first semiconductor chip 120 and the second semiconductor chip 130 are disposed downward. Subsequently, the first carrier substrate (CA1 of FIG. 12) and the first adhesive film (FI1 of FIG. 12) may be removed. In other embodiments, the first adhesive film (FIL of FIG. 12) may be maintained, and only the first carrier substrate (CA1 of FIG. 12) may be removed.

Subsequently, an external connection terminal 119 may be formed on the redistribution substrate 110. The external connection terminal 119 may be substantially the same as the description of the external connection terminal 119 of the semiconductor package 100 of FIG. 1.

Figure 14:
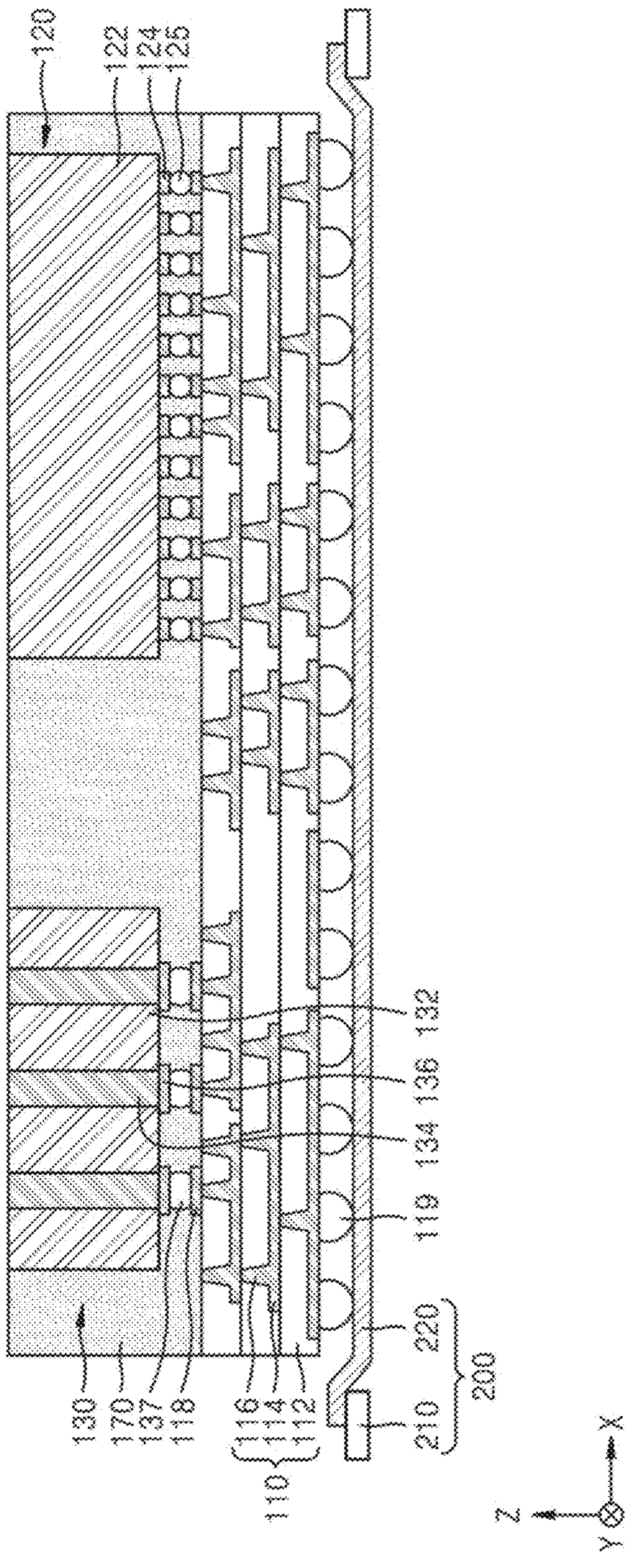

Referring to FIG. 14, the external connection terminal 119 may be attached on a film 220 of a film frame mount 200. The film frame mount 200 may include a support ring 210 having a circular ring shape and the film 220 which covers an opened portion of the support ring 210. Accordingly, the film frame mount 200 may be referred to as a ring frame mount.

After the external connection terminal 119 is attached on the film frame mount 200, a whole resultant material may be reversed so that the film frame mount 200 is disposed downward, and the second carrier substrate (CA2 of FIG. 13) and the second adhesive film (FI2 of FIG. 13) may be removed.

Figure 15:
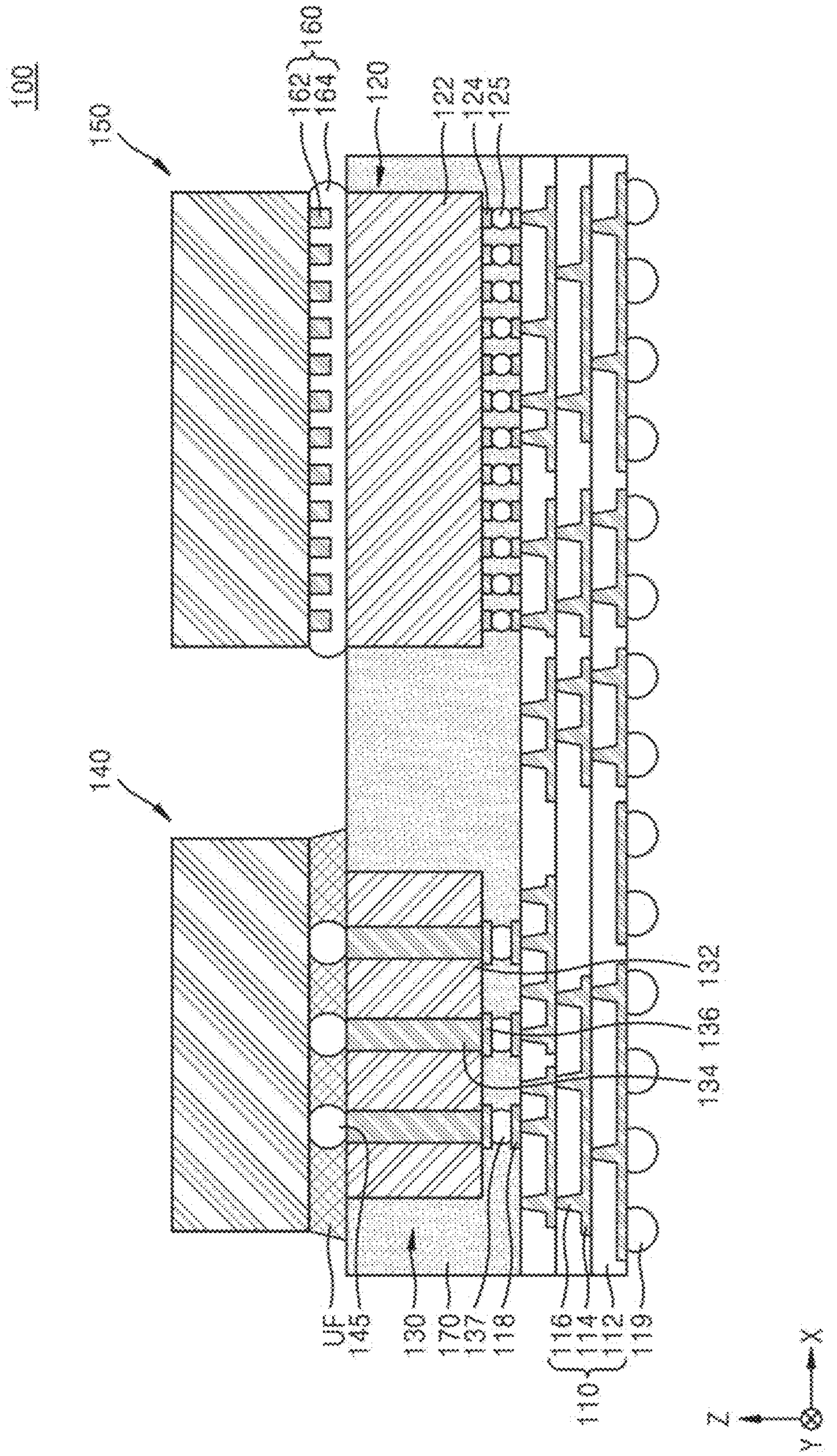

Referring to FIG. 15, the third semiconductor chip 140 and the heat dissipation chip 150 may be disposed on the sealant 170. The third semiconductor chip 140 may be electrically connected with the second semiconductor chip 130 through the third connector 145. For example, an underfill UF may be filled between the third semiconductor chip 140 and the sealant 170. In other embodiments, the underfill UF may be omitted. Also, the heat dissipation chip 150 may be disposed on the sealant 170 through a heat dissipation connector 160. The heat dissipation connector 160 may include a metal pad 162 and an adhesive layer 164. The third semiconductor chip 140 and the heat dissipation chip 150 may be disposed apart from each other in a horizontal direction (an X direction and/or a Y direction).

Subsequently, the semiconductor package 100 of FIG. 1 may be finished by removing the film frame mount (200 of FIG. 14) attached on the external connection terminal 119.

FIGS. 16 to 20 are cross-sectional views illustrating a method of manufacturing a semiconductor package, according to an embodiment. The method will be described with reference to FIGS. 16 to 20 in conjunction with FIGS. 1 and 9 to 15. FIGS. 9 to 15 illustrate a chip-first manufacturing method which manufactures first semiconductor chip 120 and the second semiconductor chip 130 prior to a redistribution substrate 110.

Figure 16:
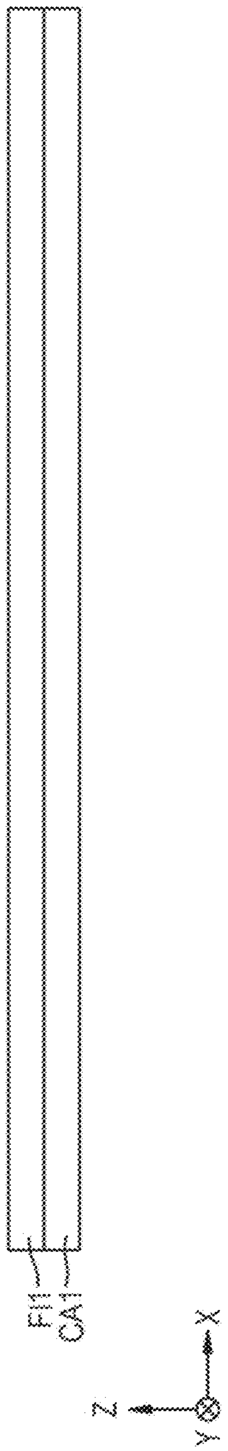
FIGS. 16, 17, 18, 19, and 20 are cross-sectional views illustrating a method of manufacturing a semiconductor package, according to an embodiment.

Referring to FIG. 16, a first adhesive film FI1 may be attached on a first carrier substrate CA1. For example, the first carrier substrate CA1 may include Si. The first adhesive film FI1 may include an arbitrary material which may fix a metal seed layer (SL of FIG. 17). For example, the first adhesive film FI1 may be a thermo-curable adhesive tape where an adhesive force is weakened by thermal treatment or may be a UV-curable adhesive tape where an adhesive force is weakened by UV irradiation.

Figure 17:
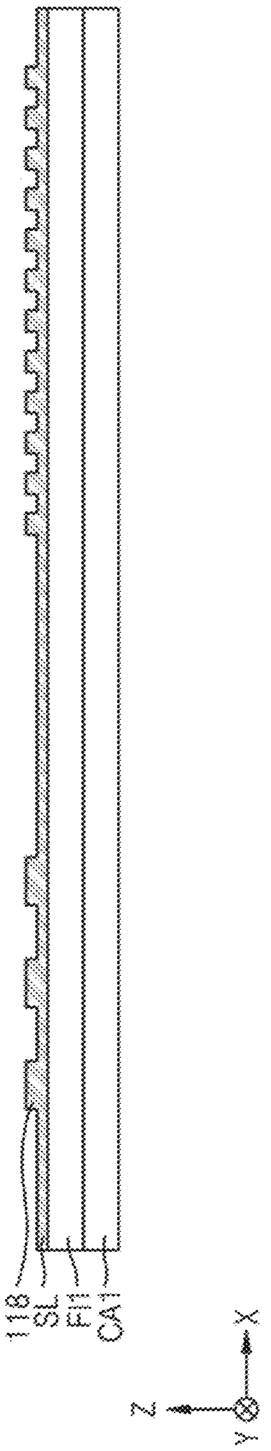

Referring to FIG. 17, the metal seed layer SL may be formed on the first adhesive film FI1. The metal seed layer SL may include, for example, a Cu single layer or a Ti/Cu multilayer. However, a material and a layered structure of the metal seed layer SL are not limited to materials and a layered structure each described above. In the Ti/Cu multilayer, a lower portion thereof may be a Ti layer, and an upper portion thereof may be a Cu layer.

After the metal seed layer SL is formed, an upper pad 118 may be formed. A photoresist pattern may be formed on the metal seed layer SL, and then, at least a portion of the metal seed layer SL may be exposed by using the photoresist pattern and the upper pad 118 may be formed by performing a plating process on the exposed metal seed layer SL. The plating process may be, for example, a Cu plating process. However, the plating process is not limited to the Cu plating process.

Therefore, a portion, where the first semiconductor chip 120 is to be disposed, of the upper pad 118 and a portion, where the second semiconductor chip 130 is to be disposed, of the upper pad 118 may differ in dimension.

Figure 18:
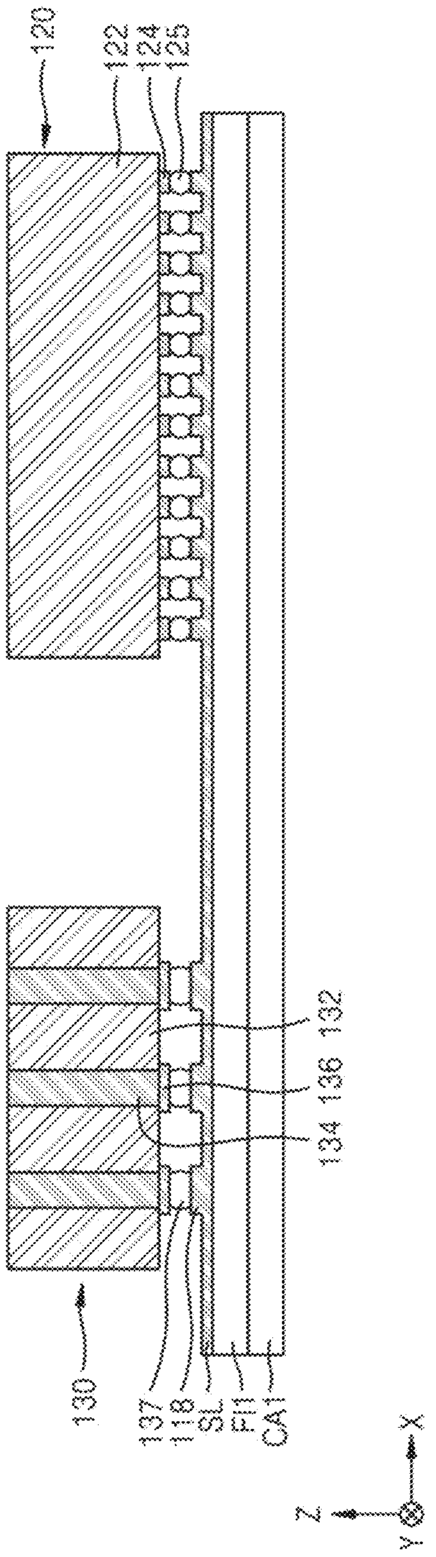

Referring to FIG. 18, the first semiconductor chip 120 and the second semiconductor chip 130 may be disposed on the upper pad 118. The first semiconductor chip 120 may be connected with the upper pad 118 through a first connector 125, and the second semiconductor chip 130 may be connected with the upper pad 118 through a second connector 137.

The first connector 125 and/or the second connector 137 may be self-aligned and connected with the upper pad 118. Therefore, the first connector 125 and/or the second connector 137 may be relatively small.

Figure 19:
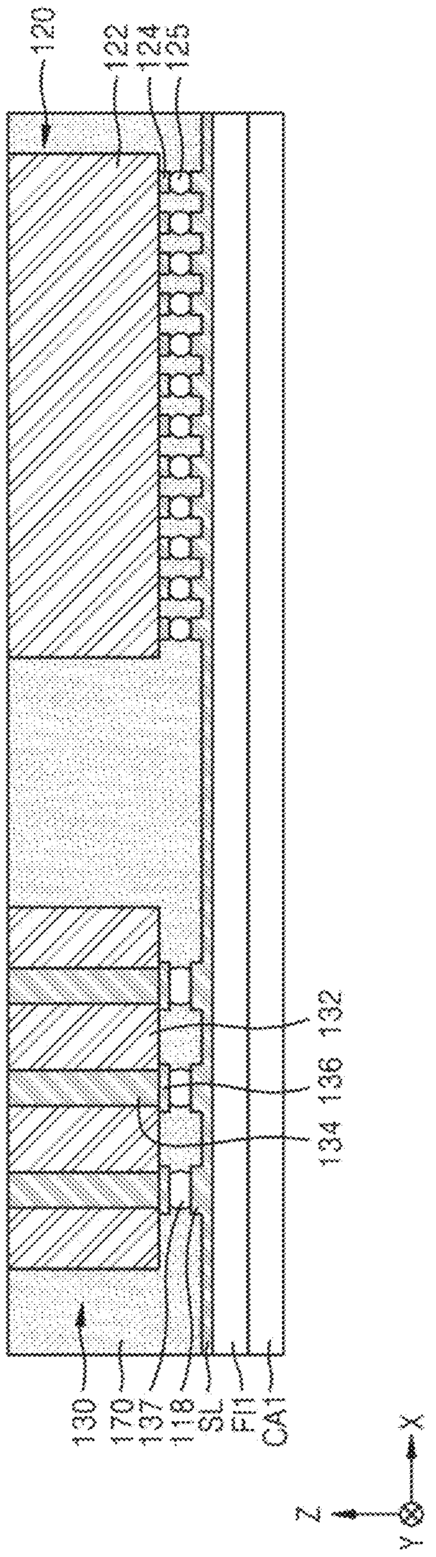

Referring to FIG. 19, a molding material covering the first semiconductor chip 120 and the third semiconductor chip 130 may be formed on the metal seed layer SL, and a sealant 170 may be formed by removing at least a portion of the molding material. For example, the molding material may be ground and may thus be removed. The molding material may be supplied onto the metal seed layer SL and may then be cured. An upper surface of the sealant 170 may be at the same vertical level as each of an upper surface of the first semiconductor chip 120 and an upper surface of the second semiconductor chip 130 or horizontally aligned with an upper surface of the first semiconductor chip 120 and an upper surface of the second semiconductor chip 130.

Figure 20:
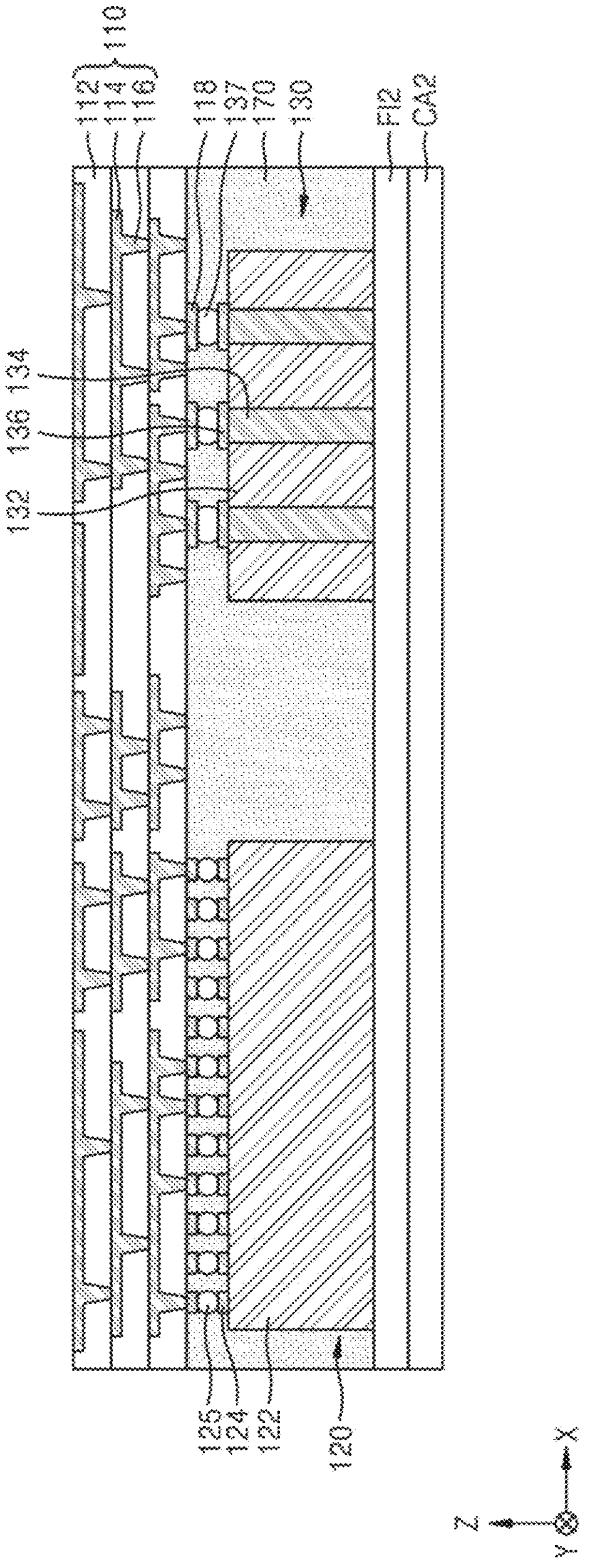

Referring to FIG. 20, a second carrier substrate CA2 and a second adhesive film FI2 may be attached on the sealant 170, and the whole structure may be reversed so that the metal seed layer SL is disposed upward and the first semiconductor chip 120 and the second semiconductor chip 130 are disposed downward. Subsequently, the first carrier substrate (CA1 of FIG. 19) and the first adhesive film (FI1 of FIG. 19) may be removed. Subsequently, the metal seed layer (SL of FIG. 19) may be removed, and the redistribution substrate 110 may be formed on the upper pad 118.

A method of manufacturing the redistribution substrate 110 may be substantially the same as the method of manufacturing the redistribution substrate 110 of FIG. 10.

Subsequently, by performing the same process as the method described above with reference to FIGS. 13 to 15, the semiconductor package 100 of FIG. 1 may be formed.

Hereinabove, embodiments have been described in the drawings and the specification. Embodiments have been described by using the terms described herein, but this has been merely used for describing the embodiments and has not been used for limiting a meaning or limiting the scope defined in the following claims. Therefore, it may be understood by those of ordinary skill in the art that various modifications and other equivalent embodiments may be implemented from the embodiments. Accordingly, the spirit and scope may be defined based on the spirit and scope of the following claims and their equivalents.

While embodiments have been described with reference to the figures, it will be understood by those of ordinary skill in the art that various changes in form and details may be made therein without departing from the spirit and scope as defined by the following claims and their equivalents.

What is claimed is:

1. A semiconductor package comprising:
- a redistribution substrate;
- a first semiconductor chip on the redistribution substrate;
- a second semiconductor chip on the redistribution substrate and spaced apart from the first semiconductor chip in a horizontal direction;
- a third semiconductor chip on the second semiconductor chip; and
- a heat dissipation chip on the first semiconductor chip and spaced apart from the third semiconductor chip in the horizontal direction,
- wherein the second semiconductor chip comprises a plurality of through vias passing through at least a portion of the second semiconductor chip in a vertical direction, and
- wherein a metal pad and an adhesive layer are between the first semiconductor chip and the heat dissipation chip.

2. The semiconductor package of claim 1, further comprising a sealant on the redistribution substrate and on a side surface of the first semiconductor chip and a side surface of the second semiconductor chip.

3. The semiconductor package of claim 2, wherein a first surface of the sealant, a first surface of the first semiconductor chip, and a first surface of the second semiconductor chip are at the same vertical level.

4. The semiconductor package of claim 1, wherein a first surface of the first semiconductor chip and a second surface of the metal pad are spaced apart from each other in the vertical direction.

5. The semiconductor package of claim 1, wherein the heat dissipation chip comprises a metal line passing through at least a portion of the heat dissipation chip in the vertical direction.

6. The semiconductor package of claim 1, wherein the third semiconductor chip comprises one or more chips.

7. The semiconductor package of claim 1, wherein the first semiconductor chip comprises a logic chip, and
- wherein the third semiconductor chip comprises a memory chip.

8. The semiconductor package of claim 1, wherein the third semiconductor chip is electrically connected with the redistribution substrate through the plurality of through vias included in the second semiconductor chip.

9. A semiconductor package comprising:
- a redistribution substrate;
- a first semiconductor chip on the redistribution substrate;
- a second semiconductor chip on the redistribution substrate and spaced apart from the first semiconductor chip in a horizontal direction;
- a third semiconductor chip on the second semiconductor chip;
- a heat dissipation chip on the first semiconductor chip and spaced apart from the third semiconductor chip in the horizontal direction;
- a fourth semiconductor chip between the first semiconductor chip and the heat dissipation chip; and
- a sealant on the redistribution substrate and on a side surface of the first semiconductor chip, a side surface of the second semiconductor chip, and a side surface the fourth semiconductor chip,
- wherein the second semiconductor chip comprises a plurality of through vias passing through at least a portion of the second semiconductor chip in a vertical direction, and
- wherein a metal pad and an adhesive layer are between the first semiconductor chip and the heat dissipation chip.

10. The semiconductor package of claim 9, wherein a first connector is between the first semiconductor chip and the redistribution substrate,
- wherein a second connector is between the second semiconductor chip and the redistribution substrate, and
- wherein each of the first connector and the second connector comprises a solder ball or a pillar.

11. The semiconductor package of claim 10, wherein a third connector is between the third semiconductor chip and the sealant, and
- wherein the third semiconductor chip is electrically connected with the redistribution substrate through the second connector, the plurality of through vias, and the third connector.

12. The semiconductor package of claim 9, further comprising a heat sink on the third semiconductor chip and the heat dissipation chip.

13. The semiconductor package of claim 9, wherein each of the first semiconductor chip and the fourth semiconductor chip comprises a logic chip,
- wherein each of the second semiconductor chip and the heat dissipation chip comprises a silicon chip, and
- wherein the third semiconductor chip comprises a memory chip.

14. The semiconductor package of claim 9, wherein a first surface of the sealant, a first surface of the second semiconductor chip, and a first surface of the fourth semiconductor chip are at the same vertical level.

15. The semiconductor package of claim 9, wherein a width of the fourth semiconductor chip is less than a width of the first semiconductor chip in the horizontal direction.

16. A semiconductor package comprising:
- a redistribution substrate comprising one or more redistribution insulation layers stacked in a vertical direction, a redistribution line extending in a horizontal direction in the one or more redistribution insulation layers, and a redistribution via extending in the vertical direction in each of the one or more redistribution insulation layers;
- a first semiconductor chip on the redistribution substrate, the first semiconductor chip comprising a first substrate and a first chip pad;
- a second semiconductor chip on the redistribution substrate and spaced apart from the first semiconductor chip in the horizontal direction, the second semiconductor chip comprising a second substrate, a second chip pad, and a plurality of through vias passing through at least a portion of the second substrate in the vertical direction;
- a third semiconductor chip on the second semiconductor chip;
- a heat dissipation chip on the first semiconductor chip and spaced apart from the third semiconductor chip in the horizontal direction;
- a first connector between the first semiconductor chip and the redistribution substrate;

a second connector between the second semiconductor chip and the redistribution substrate;

a third connector between the third semiconductor chip and the second semiconductor chip; and a heat dissipation connector between the heat dissipation chip and the first semiconductor chip, the heat dissipation connector comprising a metal pad and an adhesive layer.

17. The semiconductor package of claim 16, further comprising a fourth semiconductor chip between the first semiconductor chip and the heat dissipation chip, wherein each of the first semiconductor chip and the fourth semiconductor chip comprises an application processor (AP) chip.

18. The semiconductor package of claim 17, wherein the first semiconductor chip and the fourth semiconductor chip are bonded based on at least one of pad-to-pad bonding, hybrid bonding (HB), bonding using a bonding member, and bonding using an anisotropic conductive film (ACF).

19. The semiconductor package of claim 16, wherein a second surface of each of the plurality of through vias contacts the second chip pad, and wherein an first surface of each of the plurality of through vias contacts the third connector.

20. The semiconductor package of claim 16, further comprising a passive device on a second surface of the redistribution substrate.

* * * * *